United States Patent
Zhang

(10) Patent No.: US 9,553,017 B2
(45) Date of Patent: Jan. 24, 2017

(54) METHODS FOR FABRICATING INTEGRATED CIRCUITS INCLUDING BACK-END-OF-THE-LINE INTERCONNECT STRUCTURES

(71) Applicant: GLOBALFOUNDRIES, Inc., Grand Cayman (KY)

(72) Inventor: Xunyuan Zhang, Albany, NY (US)

(73) Assignee: GLOBALFOUNDRIES, INC., Grand Cayman (KY)

( * ) Notice: Subject to any disclaimer, the term of this patent is extended or adjusted under 35 U.S.C. 154(b) by 0 days.

(21) Appl. No.: 14/729,342

(22) Filed: Jun. 3, 2015

(65) Prior Publication Data

US 2016/0218034 A1    Jul. 28, 2016

Related U.S. Application Data

(60) Provisional application No. 62/106,788, filed on Jan. 23, 2015.

(51) Int. Cl.
*H01L 21/4763* (2006.01)
*H01L 21/768* (2006.01)
*H01L 21/306* (2006.01)

(52) U.S. Cl.
CPC ... *H01L 21/76877* (2013.01); *H01L 21/30625* (2013.01); *H01L 21/76802* (2013.01)

(58) Field of Classification Search
CPC .................. H01L 21/76802; H01L 21/76843
USPC ........................................................ 438/637
See application file for complete search history.

(56) References Cited

U.S. PATENT DOCUMENTS

| 6,720,245 B2* | 4/2004 | Stucchi ............ H01L 21/76877 257/758 |
| 6,867,073 B1* | 3/2005 | Enquist ............ H01L 21/76898 257/E21.597 |
| 8,796,859 B2 | 8/2014 | Kim |
| 2004/0127001 A1* | 7/2004 | Colburn ............ H01L 21/76801 438/586 |
| 2006/0113278 A1* | 6/2006 | Kumar ................ H01L 21/0332 216/18 |
| 2007/0037385 A1* | 2/2007 | Huebinger ........ H01L 21/02063 438/638 |

OTHER PUBLICATIONS

Yang et al. "Characterization of Copper Electromigration Dependence on Selective Chemical Vapor Deposited Cobalt Capping Layer Thickness", IEEE Electron Device Letters, Apr. 2011, pp. 560-562, vol. 32, No. 4.

* cited by examiner

*Primary Examiner* — Jami M Valentine
(74) *Attorney, Agent, or Firm* — Lorenz & Kopf, LLP

(57) ABSTRACT

Methods for fabricating integrated circuits are provided. In one example, a method for fabricating an integrated circuit includes selectively depositing a metal layer overlying a metal line of a metallization layer that is disposed in an ILD layer of dielectric material while an upper surface of the ILD layer that is laterally adjacent to the metal line is exposed. A hard mask layer is formed overlying the upper surface of the ILD layer laterally adjacent to the metal layer. The metal layer is removed to expose the metal line while leaving the hard mask layer intact. An interconnect is formed with the metal line adjacent to the hard mask layer.

19 Claims, 5 Drawing Sheets

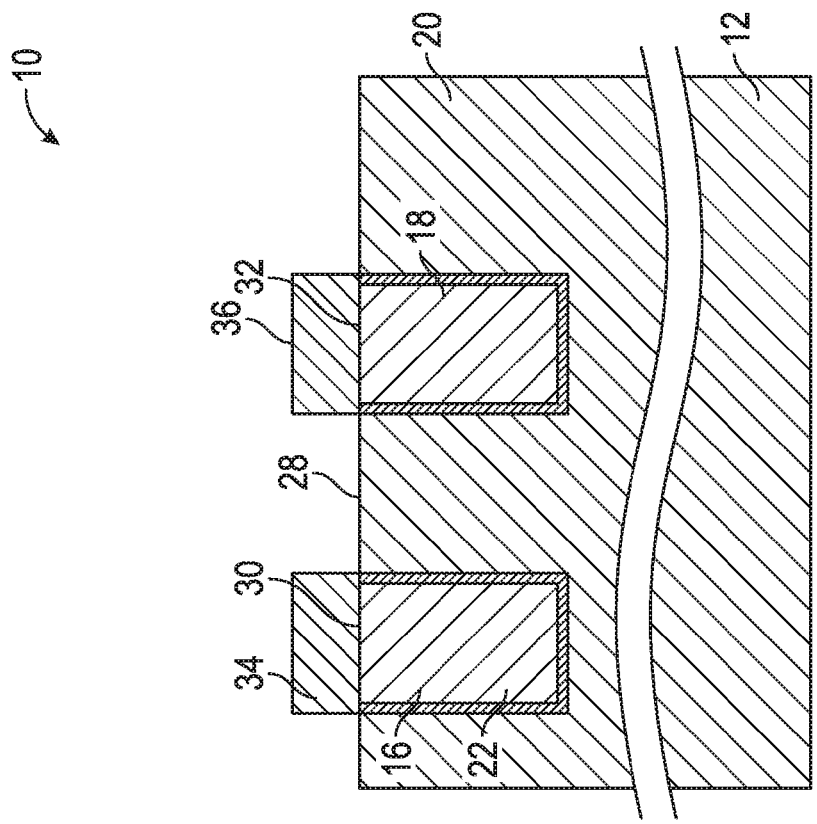
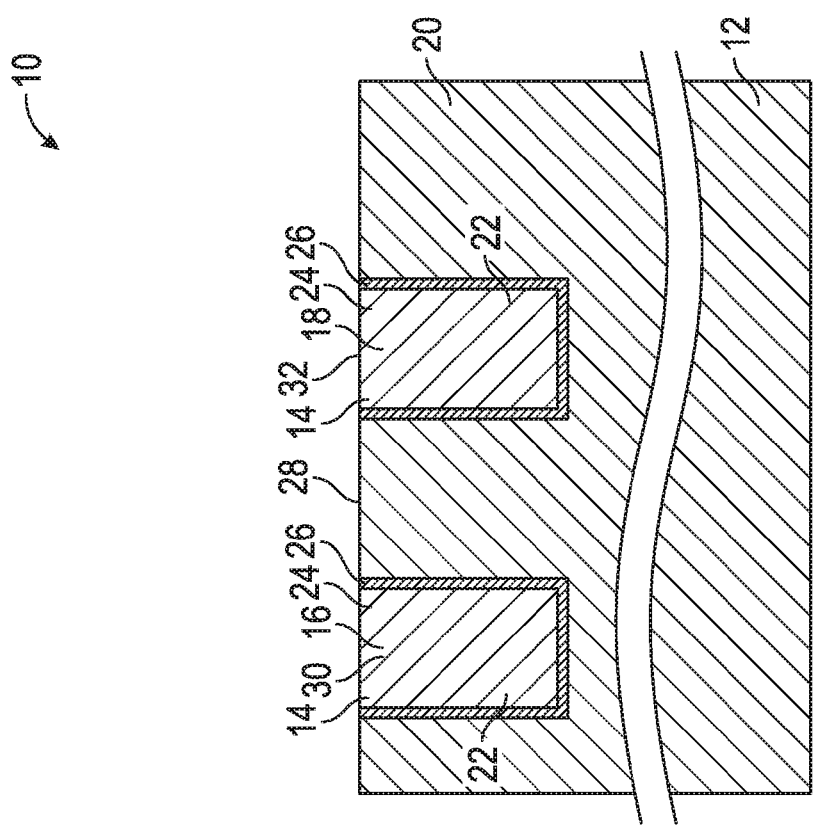

METHODS FOR FABRICATING INTEGRATED CIRCUITS INCLUDING BACK-END-OF-THE-LINE INTERCONNECT STRUCTURES

CROSS-REFERENCE TO RELATED APPLICATION

This Application claims the benefit of priority to U.S. Provisional Application Ser. No. 62/106,788, which was filed on Jan. 23, 2015 the contents of which are incorporated herein by reference in their entirety.

TECHNICAL FIELD

The technical field relates generally to methods for fabricating integrated circuits, and more particularly relates to methods for fabricating integrated circuits including forming a back-end-of-the-line interconnect structure while reducing, minimizing, or preventing dielectric breakdown, leakage issues, and/or other reliability issues in the interconnect structure.

BACKGROUND

Integrated circuits (ICs) typically include a plurality of semiconductor devices and interconnect wiring. Networks of metal interconnect wiring are often used to connect the semiconductor devices from the semiconductor portion of the substrate. Multiple levels of metal interconnect wiring form a plurality of metallization layers that are arranged in a low dielectric constant material (i.e., dielectric material) above the semiconductor portion of the substrate and are connected together to form a back-end-of-the-line ("BEOL") interconnect structure. Within such a structure, metal lines in the metallization layers typically run parallel to the substrate and conductive vias typically run perpendicular to the substrate between the metallization layers to interconnect the metal lines.

As the feature sizes of the various semiconductor devices and other elements within the IC are decreased to achieve more complex IC functions, package density limitations may be imposed by the multilayer interconnections and failure mechanisms that may arise therefrom are of greater concern. For example, in the BEOL interconnect structure, metal lines within a particular metallization layer may be densely populated or otherwise arranged relatively closely together. When an interconnection is formed with one of the densely arranged metal lines, the dielectric material surrounding the metal line interconnection and the adjacent metal lines in the metallization layer can breakdown and/or there may be leakage issues or other reliability issues between the metal line interconnection and the adjacent metal lines.

Accordingly, it is desirable to provide methods for fabricating integrated circuits including forming a back-end-of-the-line interconnect structure while reducing, minimizing, or preventing dielectric breakdown, leakage issues, and/or other reliability issues in the interconnect structure. Furthermore, other desirable features and characteristics will become apparent from the subsequent detailed description and the appended claims, taken in conjunction with the accompanying drawings and this background.

BRIEF SUMMARY

Methods for fabricating integrated circuits are provided herein. In accordance with an exemplary embodiment, a method for fabricating an integrated circuit includes selectively depositing a metal layer overlying a metal line of a metallization layer that is disposed in an ILD layer of dielectric material while an upper surface of the ILD layer that is laterally adjacent to the metal line is exposed. A hard mask layer is formed overlying the upper surface of the ILD layer laterally adjacent to the metal layer. The metal layer is removed to expose the metal line while leaving the hard mask layer intact. An interconnect is formed with the metal line adjacent to the hard mask layer.

In accordance with another exemplary embodiment, a method for fabricating an integrated circuit is provided. The method includes providing a first ILD layer of dielectric material, a first metal line, and a second metal line respectively having an ILD upper surface, a first metal line upper surface, and a second metal line upper surface that are exposed. The first and second metal lines form at least in part a metallization layer that is disposed in the first ILD layer. A metal is selectively deposited onto the first and second metal line upper surfaces while the ILD upper surface is exposed to form a first metal layer and a second metal layer that overlie the first and second metal line upper surfaces, respectively. A hard mask layer is formed overlying the ILD upper surface between the first and second metal layers. The first and second metal layers are removed to expose the first and second metal lines while leaving the hard mask layer intact. A second ILD layer of dielectric material is deposited overlying the hard mask layer and the first and second metal layers. A metal line trench and a via-hole are etched in and/or through the second ILD layer to expose the second metal line while maintaining the first metal line covered by the second ILD layer. The metal line trench and the via-hole are filled with a conductive metal fill for correspondingly forming a third metal line and a via that interconnects the third metal line with the second metal line.

In accordance with another exemplary embodiment, a method for fabricating an integrated circuit is provided. The method includes planarizing an ILD layer of dielectric material to expose an upper surface of the ILD layer and a metal line of a metallization layer that is disposed in the ILD layer. The metal line includes copper. A metal layer that includes cobalt and/or nickel is selectively grown on the metal line while the upper surface of the ILD layer is exposed. A hard mask layer is formed on the upper surface of the ILD layer laterally adjacent to the metal layer. The metal layer is etched to expose the metal line using a selective etching process that preferentially etches cobalt and/or nickel over copper and the hard mask layer. An interconnect is with the metal line adjacent to the hard mask layer.

BRIEF DESCRIPTION OF THE DRAWINGS

The various embodiments will hereinafter be described in conjunction with the following drawing figures, wherein like numerals denote like elements, and wherein:

FIGS. 1-9 illustrate, in cross-sectional views, a method for fabricating an integrated circuit during various intermediate fabrication stages in accordance with an exemplary embodiment.

DETAILED DESCRIPTION

Figure 3:
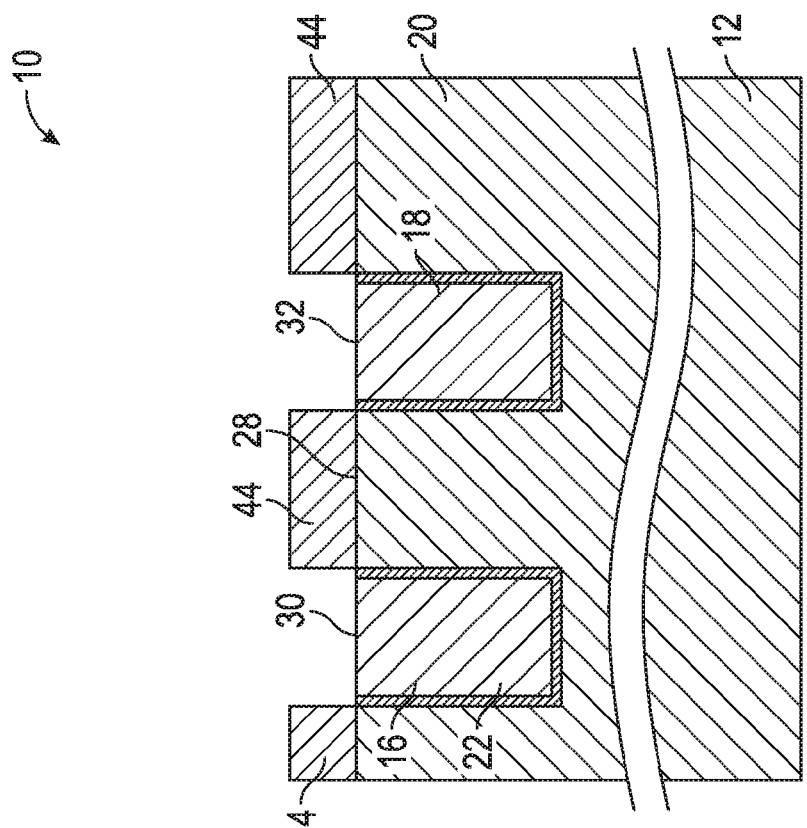

The following Detailed Description is merely exemplary in nature and is not intended to limit the various embodiments or the application and uses thereof. Furthermore, there is no intention to be bound by any theory presented in the preceding background or the following detailed description.

Various embodiments contemplated herein relate to methods for fabricating integrated circuits including forming a back-end-of-the-line (BEOL) interconnect structure. Formation of the BEOL interconnect structure includes forming a first interlayer dielectric (ILD) layer of dielectric material overlying a semiconductor substrate. In an exemplary embodiment, arranged in the first ILD layer is a metallization layer that includes a first metal line and a second metal line. The first ILD layer, the first metal line, and the second metal line respectively have an ILD upper surface, a first metal line upper surface, and a second metal line upper surface that are exposed.

In an exemplary embodiment, metal is selectively deposited onto the first and second metal line upper surfaces while the ILD upper surface is exposed. The metal is selectively deposited to form a first metal layer and a second metal layer that overlie the first and second metal line upper surfaces, respectively. A hard mask layer is formed overlying the ILD upper surface between the first and second metal layers. The first and second metal layers are removed to expose the first and second metal lines while leaving the hard mask layer intact. A second ILD layer of dielectric material is deposited overlying the hard mask layer and the first and second metal layers. In an exemplary embodiment, an interconnect is formed with the second metal line through the second ILD layer laterally adjacent to and above the hard mask layer. In an exemplary embodiment, it has been found that by forming the interconnect with the second metal line laterally adjacent to and above the hard mask layer, a pathway for the possibility of conductive material diffusing between the first metal line and the interconnect with the second metal line is effectively increased in length by being obstructed by at least a portion of the hard mask layer to help reduce, minimize, or prevent dielectric breakdown, leakage issues, and/or other reliability issues in the BEOL interconnect structure.

FIGS. 1-9 illustrate, in cross-sectional view, an integrated circuit (IC) 10 during various fabrication stages. The described process steps, procedures, and materials are to be considered only as exemplary embodiments designed to illustrate to one of ordinary skill in the art methods for fabricating integrated circuits; the methods for fabricating integrated circuits are not limited to these exemplary embodiments. Various steps in the manufacture of ICs are well known and so, in the interest of brevity, many conventional steps will only be mentioned briefly herein or will be omitted entirely without providing the well-known process details.

FIG. 1 illustrates a portion of the IC 10 during an intermediate fabrication stage in accordance with an exemplary embodiment. The IC 10 includes a semiconductor substrate 12 that may represent any appropriate carrier material, such as silicon or silicon-based materials, and the like. As used herein, the term 'semiconductor substrate' will be used to encompass semiconductor materials conventionally used in the semiconductor industry from which to make electrical devices. Semiconductor materials include monocrystalline silicon materials, such as the relatively pure or lightly impurity-doped monocrystalline silicon materials typically used in the semiconductor industry, as well as polycrystalline silicon materials, and silicon admixed with other elements such as germanium, carbon, and the like. In addition, 'semiconductor material' encompasses other materials such as relatively pure and impurity-doped germanium, gallium arsenide, zinc oxide, glass, and the like. An exemplary semiconductor material is a silicon substrate. The silicon substrate may be a bulk silicon wafer or may be a thin layer of silicon on an insulating layer (commonly known as silicon-on-insulator or SOI) that, in turn, is supported by a carrier wafer.

Additionally, the semiconductor substrate 12 may include active areas (not shown) in which a plurality of active and/or passive circuit elements (not shown), such as transistors, capacitors, resistors, and the like may be formed therein and/or thereon. It should be appreciated that the semiconductor substrate 12, even if including a substantially silicon-based material layer, may include other semiconducting materials in addition to appropriate dopant species for establishing the requisite active area conductivity type for the circuit elements.

As illustrated in FIG. 1, above the semiconductor substrate 12, the IC 10 includes a conductive interconnect structure 14 that includes metal lines 16 and 18 that are disposed in an interlayer dielectric (ILD) layer 20 of dielectric material. The ILD layer 20 may be made up of a suitable dielectric material, such as silicon dioxide ($SiO_2$), carbon-doped oxide, organosilicate glass, or the like. In an exemplary embodiment, the ILD layer 20 is a dielectric material that includes silicon and oxygen, such as $SiO_2$ or SiCOH, for example SiCOH. The ILD layer 20 may be relatively thick with a thickness, for example, of from about 200 to about 1500 nm.

Electrical connection(s) between the conductive interconnect structure 14 and the electrical devices (not shown) that may be disposed on and/or in the semiconductor substrate 12 can be established with one or more conductive vias (not shown) in the ILD layer 20. It is to be appreciated that, depending on the overall device requirements, the IC 10 may include many conductive interconnect structures 14 that may be disposed, for example, in one or more layers in which each layer defines a metallization layer 22 as is well known in the art. The metallization layers may be connected together to form a back-end-of-the-line ("BEOL") interconnect structure.

The exemplary metal lines 16 and 18 are formed of a conductive metal fill 24 that may also include a conductive seed layer as is well known in the art and a liner 26. An exemplary conductive metal fill 24 is a highly conductive material such as copper. An exemplary liner 26 is one or more layers of a liner-forming material(s) such as tantalum (Ta), tantalum nitride (TaN), ruthenium (Ru), and/or the like to help inhibit or prevent diffusion of the conductive metal fill 24 into the ILD layer 20 and/or to help hold the conductive metal fill 24 to the ILD layer 20. In an exemplary embodiment, the liner 26 is formed of multiple layers including a barrier layer of Ta with one or more overlying liner layers of TaN. In an exemplary embodiment, the liner 26 has a thickness of from about 0.5 to about 10 nm.

The illustrated portion of the IC 10 may be formed on the basis of well-known techniques. In an exemplary embodiment, the ILD layer 20 is formed by depositing a dielectric material such as $SiO_2$ or SiCOH that includes organic porogen overlying the semiconductor substrate 12. The dielectric material may be deposited using a chemical vapor deposition (CVD) process and the dielectric material may be treated, for example with UV radiation, to out gas the porogen and form porosity in the ILD layer 20 to further lower the dielectric constant of the dielectric material. Next, the exemplary ILD layer 20 is patterned and etched using, for example, a dry etching process to form metal line trenches as well as via-holes (not shown). The metal line trenches and via-hole are then filled by depositing the liner-forming material(s) and the conductive metal fill 24 into the trenches and holes, such as by using a physical vapor deposition (PVD) process (or an atomic layer deposition (ALD) process) and an electrochemical plating (ECP) process, respectively, to form the conductive interconnect structure 14. Any overburden of the conductive metal fill 24 and/or the liner-forming material(s) is removed by chemical mechanical planarization (CMP) to expose upper surfaces 28, 30, and 32 of the ILD layer 20 and the metal lines 16 and 18, respectively.

FIG. 2 illustrates the IC 10 during a further advanced fabrication stage in accordance with an exemplary embodiment. Metal layers 34 and 36 are selectively deposited on the upper surfaces 30 and 32 of the metal lines 16 and 18 while the upper surface 28 of the ILD layer 20 is exposed, i.e., the upper surface 28 of the ILD layer 20 is not masked during formation of the metal layers 34 and 36. The metal layers 34 and 36 may be formed by selectively depositing a metal that may be a metal based material(s) or a metal alloy onto the metal lines 16 and 18. In an exemplary embodiment, the metal includes cobalt and/or nickel, such as, for example, the metal is a cobalt based material(s).

In an exemplary embodiment, the metal layers 34 and 36 are formed by selectively growing the metal in a substantially vertical direction from the upper surfaces 30 and 32 of the metal lines 16 and 18 using, for example, a CVD process (e.g., a CVD Co metal cap process that is commercially available from Applied Materials) or an electroless deposition process. In one embodiment, the metal lines 16 and 18 are formed by exposing the upper surfaces 28, 30, and 32 to an electroless deposition solution that contains cobalt, which deposits and grows cobalt only on the upper surfaces 30 and 32 where metal is already present, e.g., the liner 26 and the conductive metal fill 24. As illustrated, cobalt (or other metal) is deposited on and grows upward from the upper surfaces 30 and 32 substantially in a vertical direction and does not deposit and grow on or over the upper surface 28 of the ILD layer 20.

Electroless deposition solutions for cobalt are well known and typically include, for example, a source of cobalt ions, a reducing agent, and a complexing agent and/or a chelating agent. In an exemplary embodiment, the electroless deposition process occurs with the electroless deposition solution at a temperature of from about 20 to about 100° C. and for a time sufficient to permit cobalt to form the metal layers 34 and 36, for example, having a thickness of from about 5 to about 20 nm.

Figure 4:
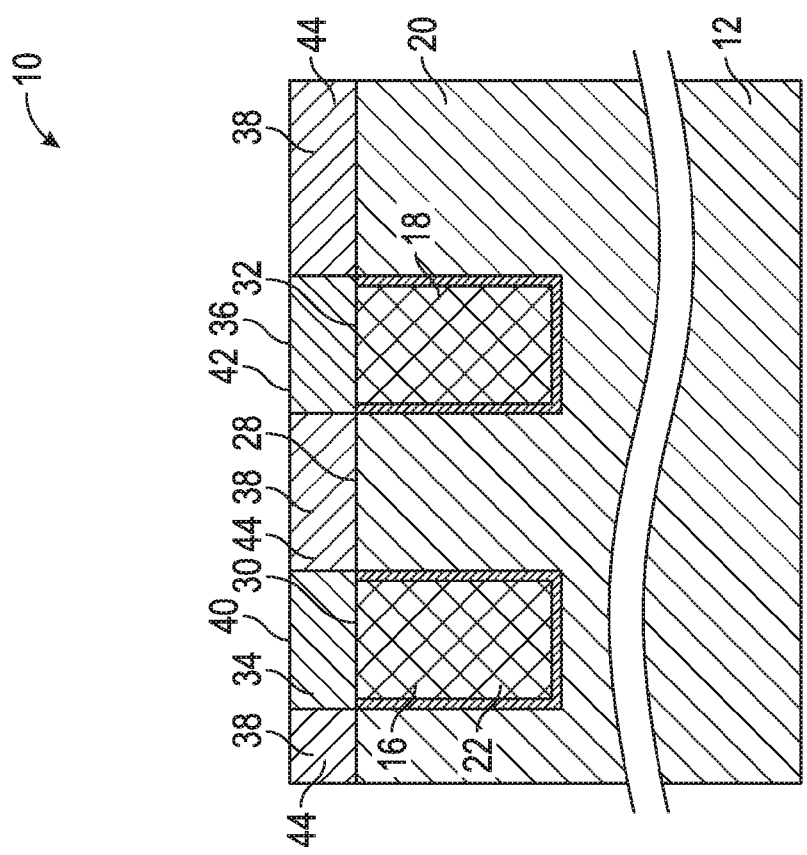
Figure 5:
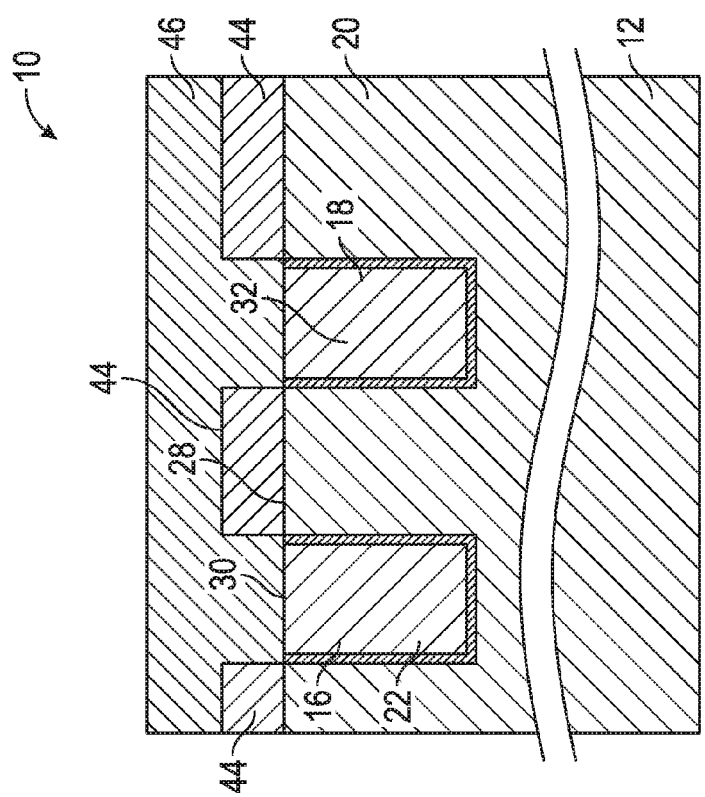

FIGS. 3-5 illustrate the IC 10 during further advanced fabrication stages in accordance with an exemplary embodiment. Referring to FIG. 3, in an exemplary embodiment, a hard mask-forming material 38 (e.g., silicon dioxide, silicon nitride, or the like) is deposited overlying the metal layers 34 and 36 and the upper surface 28 of the ILD layer 20. The hard mask-forming material 38 is planarized to the upper surfaces 40 and 42 of the metal layers 34 and 36 to form the hard mask layer 44. The hard mask-forming material 38 is deposited, for example, by the decomposition of a source material such as tetraethylorthosilicate (TEOS) and is planarized, for example, by a CMP process. In an exemplary embodiment, the hard mask layer 44 has a thickness of from about 5 to about 20 nm, such as from about 10 to about 15 nm.

Referring also to FIG. 4, the metal layers 34 and 36 are removed by selectively etching the metal layers 34 and 36 to expose the upper surfaces 30 and 32 of the metal lines 16 and 18 while leaving the hard mask layer 44 intact. In an exemplary embodiment, the metal layers 34 and 36 are selectively etched by exposing the upper surfaces 40 and 42 of the metal layers 34 and 36 and the hard mask layer 44 to a selective etching process that preferentially etches cobalt and/or nickel, such as cobalt, over copper, Ta/TaN, and/or Ru also the hard mask layer 44. The selective etching process may be a dry etching process, or alternatively, a wet etching process. In an exemplary embodiment, in general, a relatively weak acid or acidic solution can dissolve cobalt without attacking copper since copper is more noble than cobalt. As shown, the hard mask layer 44 is left intact.

The process continues as illustrated in FIG. 5 by depositing a dielectric cap 46 overlying the metal lines 16 and 18 and the hard mask layer 44. The dielectric cap 46 is a dielectric material containing, for example, silicon and nitrogen, oxygen, carbon, and/or hydrogen. In an exemplary embodiment, the dielectric cap 46 is a C-doped SiN layer that is deposited using a CVD process and has a thickness of from about 10 to about 50 nm.

Figure 6:
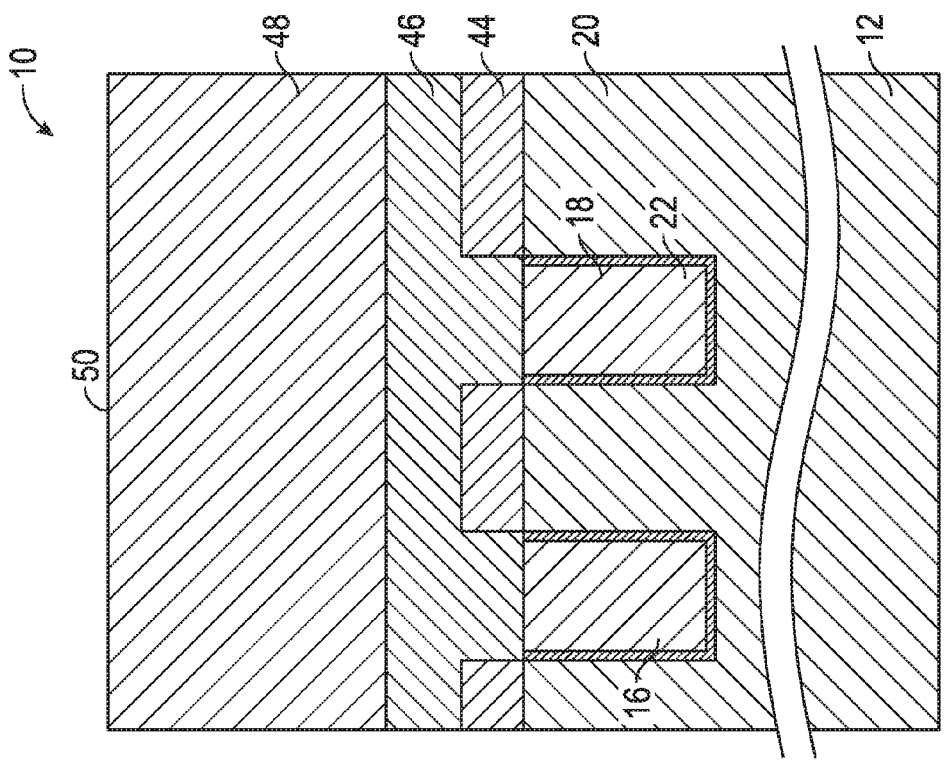
Figure 7:
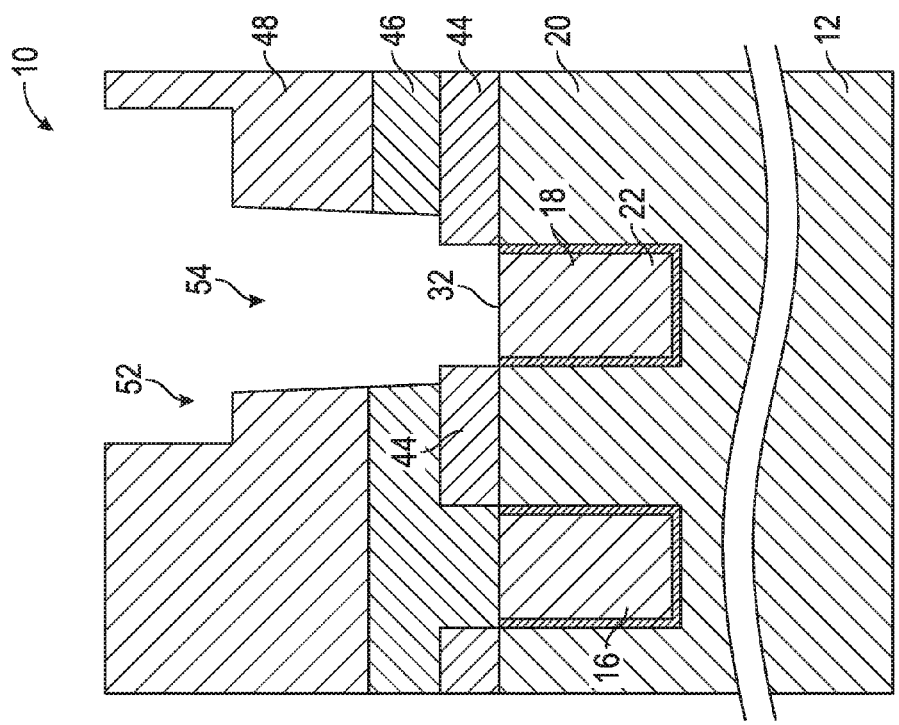

FIGS. 6-9 illustrate the IC 10 during further advanced fabrication stages in accordance with an exemplary embodiment. The process continues as illustrated in FIG. 6 by depositing an ILD layer 48 overlying the dielectric cap 46 followed by CMP to expose an upper-surface portion 50 of the ILD layer 48. In an exemplary embodiment and as illustrated in FIG. 7, a metal line trench 52 and a via-hole 54 are etched into the ILD layer 48, and the via-hole 54 extends further through the ILD layer 48 and the dielectric cap 46 to expose the metal line 18. The metal line 16 remains covered by the ILD layer 48 and the dielectric cap 46. The metal line trench 52 and the via-hole 54 may be formed using well-known lithography and etching techniques (e.g., dry etching techniques such as plasma etching or the like).

Figure 8:
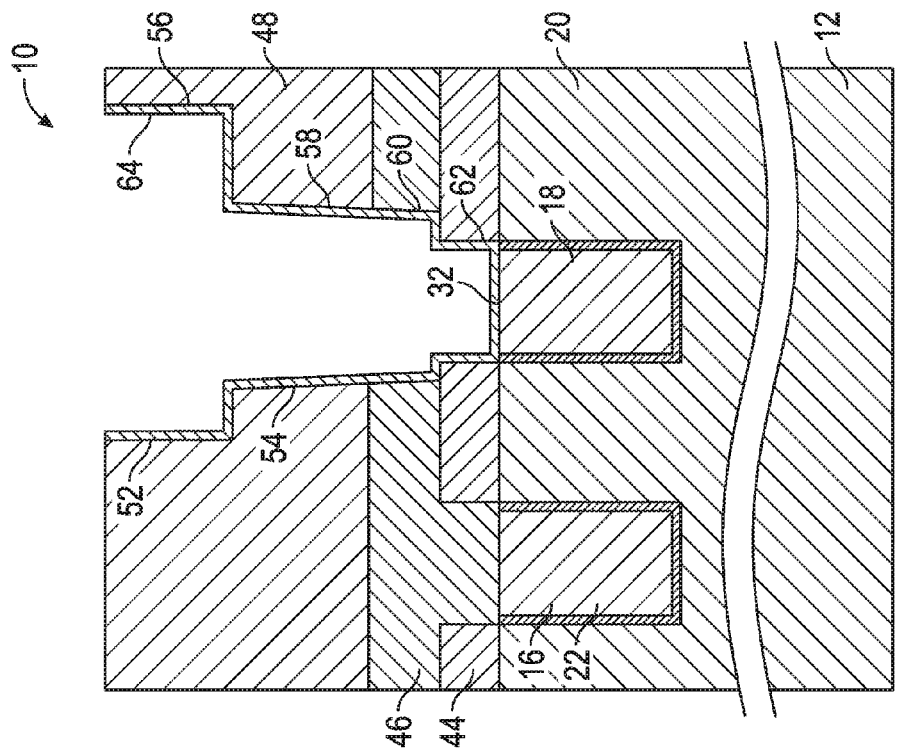

A liner-forming material(s) is then deposited into the metal line trench 52 and the via-hole 54 along sidewalls 56, 58, 60, and 62 of the ILD layer 48, the dielectric cap 46, and the hard mask layer 44 and including over the upper surface 32 of the metal line 18 to form a liner 64 as illustrated in FIG. 8. In an exemplary embodiment, the liner-forming material(s) includes Ta, TaN, Ru, and/or like and is deposited using a PVD process, a CVD process, an ALD process, and/or the like.

Figure 9:
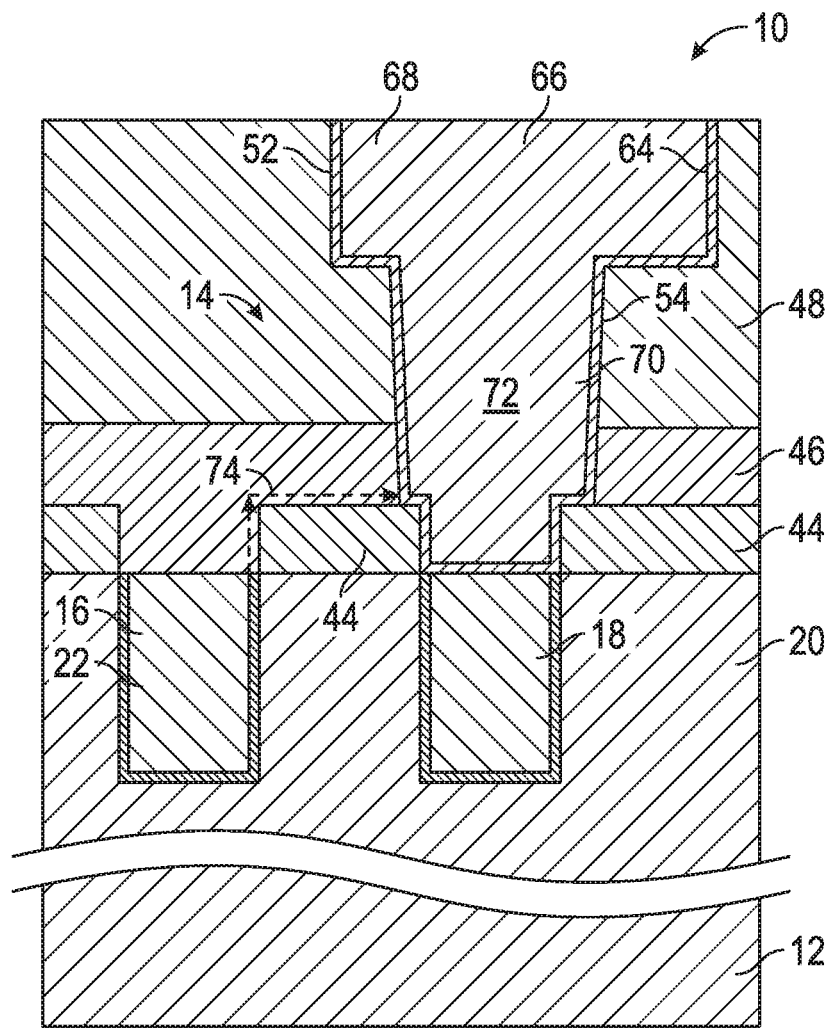

The process continues as illustrated FIG. 9 by depositing a conductive metal fill 66 (e.g., copper or copper alloy) into the metal line trench 52 and the via-hole 54 overlying the liner 64 to form a metal line 68 and a via 70 that forms an interconnect 72 between the metal line 18 and the metal line 68. As is well-known in the art, a copper seed layer may be deposited overlying the liner 64 prior to depositing the conductive metal fill 66 using, for example, a PVD process. In an exemplary embodiment, the conductive metal fill 66 is deposited overlying the liner 64 using an electrochemical plating (ECP) process. Any overburden of the conductive metal fill 66 may be removed by planarizing the ILD layer 48, the liner 64, and the conductive metal fill 66 using a CMP process. In an exemplary embodiment, it has been found that by forming the interconnect 72 with the metal line 18 laterally adjacent to and above the hard mask layer 44, a pathway (indicated by dashed lines 74) for the possibility of conductive material diffusing between the metal line 16 and the interconnect 72 with the metal line 18 is effectively increased in length by being obstructed by at least a portion of the hard mask layer 44 to help reduce, minimize, or prevent dielectric breakdown, leakage issues, and/or other reliability issues within the conductive interconnect structure 14. In an exemplary embodiment, it is believed that the dielectric cap 46 acts as a copper barrier such that copper ions have to diffuse through the pathway 74 and furthermore, the via-hole 54 has a maximum electrical contact area with the metal line 18 by fully covering the upper surface 32 so as to significantly lower the via resistance between the metal line 18 and the interconnect 72.

Accordingly, methods for fabricating integrated circuits have been described. In an exemplary embodiment, an integrated circuit is fabricated by selectively depositing a metal layer overlying a metal line of a metallization layer that is disposed in an ILD layer of dielectric material while leaving an upper surface of the ILD layer that is laterally adjacent to the metal line exposed. A hard mask layer is formed overlying the upper surface of the ILD layer laterally adjacent to the metal layer. The metal layer is removed to expose the metal line while leaving the hard mask layer intact. An interconnect is formed with the metal line adjacent to the hard mask layer.

While at least one exemplary embodiment has been presented in the foregoing detailed description of the disclosure, it should be appreciated that a vast number of variations exist. It should also be appreciated that the exemplary embodiment or exemplary embodiments are only examples, and are not intended to limit the scope, applicability, or configuration of the disclosure in any way. Rather, the foregoing detailed description will provide those skilled in the art with a convenient road map for implementing an exemplary embodiment of the disclosure. It being understood that various changes may be made in the function and arrangement of elements described in an exemplary embodiment without departing from the scope of the disclosure as set forth in the appended claims.

What is claimed is:

1. A method for fabricating an integrated circuit, the method comprising:
   selectively depositing a metal layer overlying a metal line of a metallization layer that is disposed in an ILD layer of dielectric material while an upper surface of the ILD layer that is laterally adjacent to the metal line is exposed;
   forming a hard mask layer overlying the upper surface of the ILD layer laterally adjacent to the metal layer, wherein forming the hard mask layer comprises:
      depositing a hard mask-forming material overlying the upper surface of the ILD layer; and
      planarizing the hard mask-forming material and the metal line using a chemical mechanical planarization (CMP) process to form the hard mask layer;
   removing the metal layer to expose the metal line while leaving the hard mask layer intact; and
   forming an interconnect with the metal line adjacent to the hard mask layer.

2. The method of claim 1, wherein selectively depositing the metal layer comprises depositing a metal that comprises cobalt and/or nickel on the metal line.

3. The method of claim 1, wherein selectively depositing the metal layer comprises depositing cobalt on the metal line.

4. The method of claim 1, wherein selectively depositing the metal layer comprises selectively depositing a metal on the metal line using a chemical vapor deposition (CVD) process.

5. The method of claim 1, wherein selectively depositing the metal layer comprises selectively depositing a metal on the metal line using an electroless deposition process.

6. The method of claim 1, wherein selectively depositing the metal layer comprises forming the metal layer having a thickness of from about 5 to about 20 nm.

7. The method of claim 1, wherein selectively depositing the metal layer comprises forming the metal layer having a thickness of from about 5 to about 20 nm.

8. The method of claim 1, wherein forming the hard mask layer comprises forming the hard mask layer having a thickness of from about 5 to about 20 nm.

9. The method of claim 1, wherein etching the metal layer comprises removing the metal layer using a wet etching process.

10. A method for fabricating an integrated circuit, the method comprising:
    providing a first ILD layer of dielectric material, a first metal line, and a second metal line respectively having an ILD upper surface, a first metal line upper surface, and a second metal line upper surface that are exposed, wherein the first and second metal lines form at least in part a metallization layer that is disposed in the first ILD layer;
    selectively depositing a metal onto the first and second metal line upper surfaces while the ILD upper surface is exposed to form a first metal layer and a second metal layer that overlie the first and second metal line upper surfaces, respectively;
    forming a hard mask layer overlying the ILD upper surface between the first and second metal layers;
    removing the first and second metal layers to expose the first and second metal lines while leaving the hard mask layer intact;
    depositing a second ILD layer of dielectric material overlying the hard mask layer and the first and second metal layers;
    etching a metal line trench and a via-hole in and/or through the second ILD layer to expose the second metal line while maintaining the first metal line covered by the second ILD layer; and
    filling the metal line trench and the via-hole with a conductive metal fill for correspondingly forming a third metal line and a via that interconnects the third metal line with the second metal line.

11. The method of claim 10, further comprising depositing a dielectric cap overlying the first and second metal lines and the hard mask layer after removing the first and second metal layers, wherein depositing the second ILD layer comprises depositing the second ILD layer overlying the dielectric cap, and wherein etching the metal line trench and the via-hole comprises etching the via-hole through the dielectric cap to expose the second metal line.

12. The method of claim 11, wherein depositing the dielectric cap comprises depositing an C-doped SiN layer as the dielectric cap.

13. The method of claim 11, wherein depositing the dielectric cap comprises depositing the dielectric cap using a chemical vapor deposition (CVD) process.

14. The method of claim 11, wherein depositing the dielectric cap comprises forming the dielectric cap having a thickness of from about 10 to about 50 nm.

15. The method of claim 10, further comprising forming a liner along sidewalls of the metal line trench and the via-hole and overlying the second metal line, and wherein filling the metal line trench and the via-hole comprises depositing the conductive metal fill in the metal line trench and the via-hole overlying the liner.

16. The method of claim 15, wherein forming the liner comprises forming the liner using a physical vapor deposition (PVD) and/or a chemical vapor deposition (CVD) process and/or an atomic layer deposition (ALD) process.

17. The method of claim 10, wherein filling the metal line trench and the via-hole comprises depositing the conductive metal fill in the metal line trench and the via-hole using an electrochemical plating (ECP) process.

18. The method of claim 10, further comprising planarizing the second ILD layer and the conductive metal fill using a chemical mechanical planarization (CMP) process.

19. A method for fabricating an integrated circuit, the method comprising:
   planarizing an ILD layer of dielectric material to expose an upper surface of the ILD layer and a metal line of a metallization layer that is disposed in the ILD layer, wherein the metal line comprises copper;
   selectively growing a metal layer that comprises cobalt and/or nickel on the metal line while the upper surface of the ILD layer is exposed;
   forming a hard mask layer on the upper surface of the ILD layer laterally adjacent to the metal layer;
   etching the metal layer to expose the metal line using a selective etching process that preferentially etches cobalt and/or nickel over copper and the hard mask layer; and
forming an interconnect with the metal line adjacent to the hard mask layer.

* * * * *